United States Patent [19]

Koon

[11] Patent Number: 4,620,366
[45] Date of Patent: Nov. 4, 1986

[54] AUTOMATIC PIN EXTRACTION APPARATUS FOR INTEGRATED CIRCUIT TUBE

[75] Inventor: Ooi T. Koon, Selangor, Malaysia

[73] Assignee: RCA Corporation, Princeton, N.J.

[21] Appl. No.: 755,915

[22] Filed: Jul. 17, 1985

[51] Int. Cl.[4] .............................................. B23P 19/00
[52] U.S. Cl. .................................... 29/762; 29/426.5; 29/741
[58] Field of Search ...................... 29/762, 808, 426.5, 29/741, 739, 740

[56] References Cited

U.S. PATENT DOCUMENTS

| | | | |
|---|---|---|---|
| 3,382,558 | 5/1965 | Lutz et al. | 29/762 |
| 3,783,486 | 9/1972 | Wagner, Jr. | 29/203 |
| 4,207,665 | 10/1978 | Kurek | 29/270 |
| 4,402,133 | 9/1983 | Cribbs et al. | 29/762 |
| 4,432,125 | 2/1984 | Monteleone et al. | 29/426.5 |
| 4,442,593 | 5/1984 | Holmberg | 29/762 |

FOREIGN PATENT DOCUMENTS 668976 8/1963 Canada .

OTHER PUBLICATIONS

Donnelly & Stagakis, *Pin Extracting Tool*, Western Electric Technical Digest, No. 59, at 9 (Jul. 1980).
Byrnes, Poluzzi, & McKnight, Insertion/Extraction Tool for 'Popout', Contactors, IBM Technical Disclosure Bulletin, vol. 20, No. 11A, Apr. 1978.
"The Unpeg Machine H-501 Series," *Trio-Tech International*.

*Primary Examiner*—Howard N. Goldberg
*Assistant Examiner*—Irene Graves Golabi
*Attorney, Agent, or Firm*—Joseph S. Tripoli; William Squire

[57] ABSTRACT

A pneumatic system ejects a retaining pin from an integrated circuit package carrier tube. The system includes a tube alignment channel for aligning the retaining pin in the tube with a pneumatically operated ejection rod. A pneumatic valve automatically senses the aligned tube and pin and immediately causes the retaining pin to be ejected in response to the sensed alignment.

6 Claims, 6 Drawing Figures

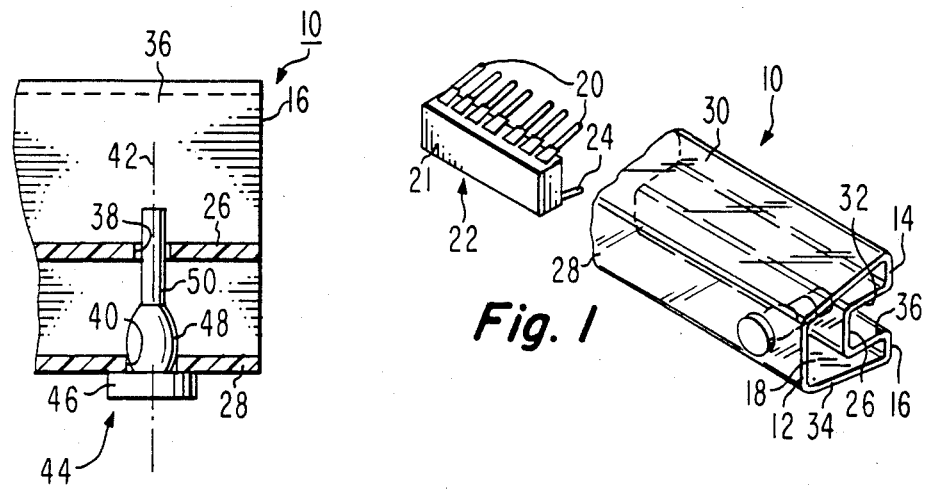
Fig. 1
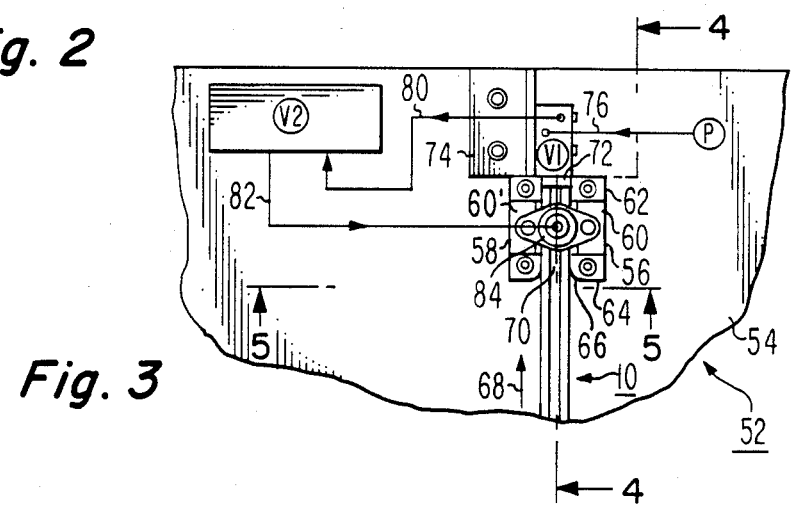
Fig. 2
Fig. 3
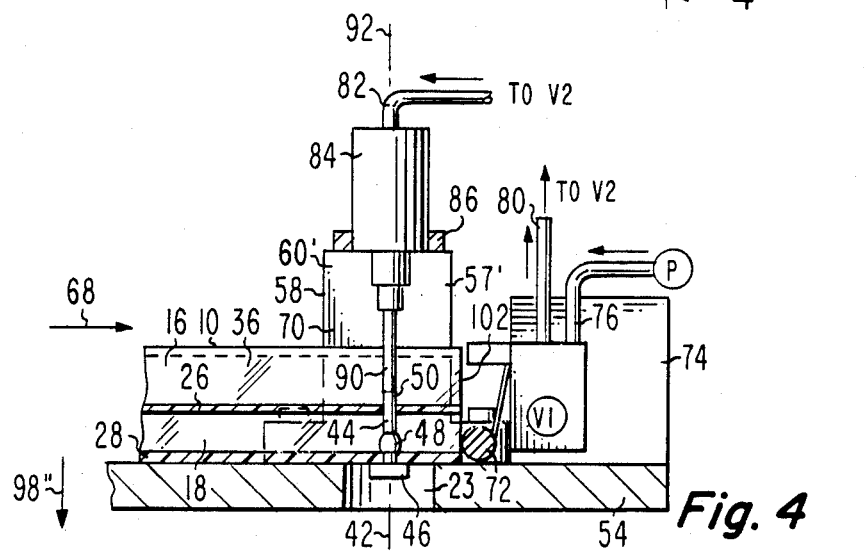
Fig. 4

AUTOMATIC PIN EXTRACTION APPARATUS FOR INTEGRATED CIRCUIT TUBE

This invention relates to an apparatus for ejecting a retaining pin from a thermoplastic integrated circuit package storage tube.

Dual in-line integrated circuit packages comprise a rectangular housing and beam leads extending therefrom. The circuits in the packages can be damaged if exposed to static charges and therefore require special handling. These packages are stored and transported in protective elongated hollow tubular thermoplastic tubes which are generally U-shaped in section (FIG. 1). The body of the integrated circuit package is disposed in the base of the U and the beam leads are each disposed in a separate leg of the channel of the tube.

The tube has aligned holes adjacent each end to receive an integrated circuit package retaining pin to lock the packages within the tube. The retaining pin is molded of thermoplastic material and includes a head and a shaft extending from the head having an enlarged bulbous portion adjacent the head. The shaft extends through both holes in the base portion of the tube channel. The enlarged portion is larger than the hole and is adjacent to the pin head and when passed through the hole flexes the wall of the hole captivating the pin in place.

This interlocked relationship of the pin to the tube makes it relatively difficult to remove the pin in order to empty the integrated circuit packages from the tube. Some prior efforts to remove the pin from the tube include manual techniques, such as using pliers and so forth, which tend to damage the tube. Such damage is extremely wasteful when large numbers of tubes are necessary in a given manufacturing operation.

U.S. Pat. No. 4,207,665 is addressed to this problem and discloses a pin extractor. However, the disclosed extractor requires the manual engagement of the extractor with the tube in which the extractor includes claws for engaging and dislodging the pin. The disclosed pin extractor requires the pin extractor to be engaged with the tube by hand in order to operate. This can be relatively slow and time consuming. There is also available automatic equipment using a motor driven cam for removing such pins. This equipment is relatively unreliable and tends to fail after continuous use.

In accordance with the present invention, an automatic pin extraction apparatus removes a retaining pin from an elongated U-shaped tube wherein the pin includes an enlarged bulbous shaft portion for interlocking the pin with a wall of the tube. The apparatus includes guide means for aligning the tube and pin in a given reference position and orientation. Fluid operable pin ejection means includes sense means coupled to the guide means for sensing the presence of the aligned tube and pin and fluid operated means for automatically ejecting the pin from the tube in response to the sensed aligned tube and pin.

In the drawing:

FIG. 1 is an isometric view of a thermoplastic dual in-line integrated circuit package storage and carrier tube;

FIG. 2 is a sectional view through the tube of FIG. 1 illustrating the tube and retaining pin construction;

FIG. 3 is a plan view of an apparatus in accordance with only embodiment of the present invention for automatically pneumatically extracting the retaining pin from the tube structure of FIGS. 1 and 2;

FIG. 4 is a sectional view of the apparatus of FIG. 3 taken along lines 4—4;

Figure 5:
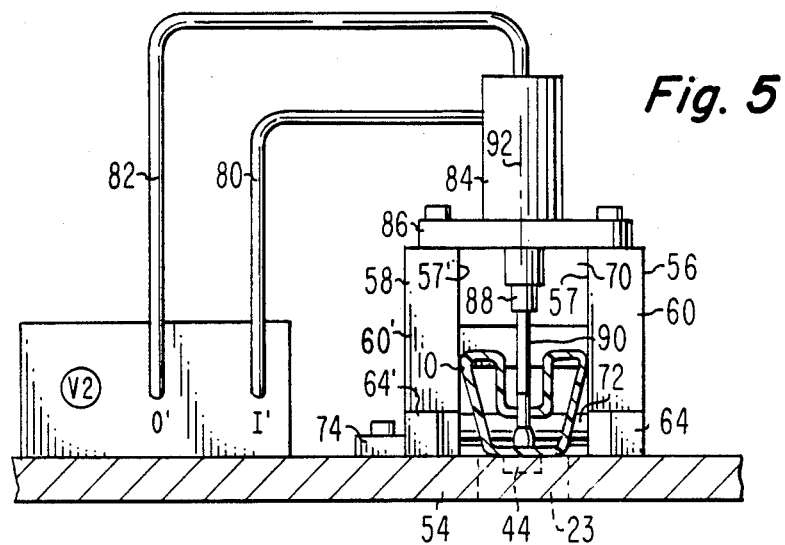
FIG. 5 is a sectional view of the apparatus of FIG. 3 taken along lines 5—5.

In FIGS. 1 and 2, integrated circuit package storage tube 10 comprises a commercially available thin walled thermoplastic U-shaped structure having a central base portion 12, and first and second leg portions 14 and 16, respectively. The base portion 12 comprises two parallel walls 26 and 28. Leg portion 14 comprises a pair of spaced walls 30 and 32 extending from respective walls 28 and 26. Leg portion 16 comprises a pair of spaced walls 34 and 36 extending from walls 28 and 26, respectively. The respective ends of the walls of each leg portion are connected to form an enclosed cavity 18. The cavity 18 is U-shaped in which leg portion 14 receives one lead array 20 of integrated circuit package 22 and the other leg portion 16 cavity receives the other lead array 24. Body 21 of the integrated circuit package 22 slides in the cavity 18 between walls 26 and 28. In FIG. 2, walls 26 and 28 have respective apertures 38 and 40 aligned on axis 42. A second pair of like aligned holes (not shown) are located at the other end of tube 10.

After the tube 10 is filled with integrated circuit packages 22, FIG. 1, a retaining pin 44 is inserted in apertures 38 and 40 at each end. Pin 44 includes a head 46, an enlarged bulbous portion 48 extending from head 46, and a circular cylindrical shaft portion 50 extending from portion 48. The enlarged portion 48 has a maximum diameter which is larger than the diameter of circular aperture 40. A region between head 46 and that maximum diameter is smaller than aperture 40. The tube wall 28 being thermoplastic, flexes in response to the insertion of the bulbous portion 48 passing therethrough. Once the bulbous portion 48 passes through the aperture 40, the aperture wall tends to return to its original shape and size, captivating pin 44 to wall 28. The shaft 50 is sufficiently long to pass through aperture 38 when the pin is so captivated. In the alternative, the enlarged portion 48 can be at the pin extended end similar to that shown in U.S. Pat. No. 4,207,665 mentioned above.

In FIGS. 3 and 4, apparatus 52 automatically and quickly removes the pin 44 without electrical or physical damage to the tube 10, the integrated circuits in the tube, or the pin. Apparatus 52 includes a base plate 54. Plate 54, FIG. 4, has a pin 44 receiving hole 23 aligned on axis 92. A pair of parallel spaced T-shaped tube guides 56 and 58 of mirror image construction are secured to plate 54. The primed numbers on guide 58 indicate like elements corresponding to the same unprimed numbers of guide 56. Guide 56 comprises a main support pillar 60 and a pair of flanges 62 and 64 which are screwed to base plate 54 and which together have a plane tube guide surface 57, FIG. 5. Ingress corner 66 of flange 64, FIG. 3, is rounded to guide tube 10 in direction 68 into the channel 70 formed by the respective facing guide surfaces 57 and 57' of guides 56 and 58. The base plate's 54 upper surface forms the base of the channel 70, FIG. 5.

In FIGS. 3, 4, and 5, a 3/2-way valve V1 with an actuation roller lever 72, FIG. 4, is secured to L-shaped bracket 74 secured to base 54, FIG. 4. A 3/2-way valve is one which has three ports I, V, and O, FIG. 6, and two switch states A and B. State B is the normal state when lever 72 is not depressed. State A represents the state when lever 72 is depressed. Valve V1 has one port I connected to a source P of pressurized fluid, e.g., air, through line 76. In the switch B state shown in FIG. 6, line 80 is connected as an input to valve V1 at port O whose output port V vents the fluid on line 80 to the atmosphere. In the second switch position, state A, line 80 is connected to source P line 76 via conduit 80'. Valve V1 may be a Festo type S-3-PK-3 having a roller ever 72 type AR-06.

Figure 6:
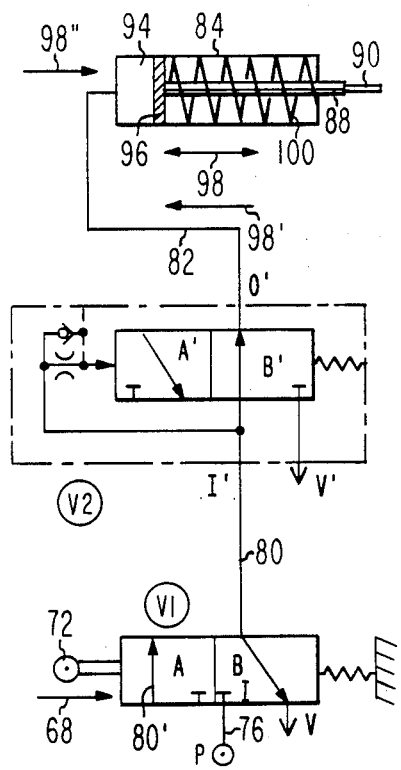
FIG. 6 is a schematic circuit diagram of the pneumatic system of the embodiment of FIG. 3.

Line 80 is coupled to input port I' of valve V2 FIGS. 5 and 6. Valve V2 is a single impulse type which has an output at port O' connected to line 82. Upon receipt of a supply of pressurized fluid from source P via conduit 80' of valve V1 and line 80 when lever 72 is depressed, a pressurized fluid pulse of a given time duration is produced at port O'. Valve V2 may be a Festo type VLK-3-PK-3. The valve V2 port O' is fluid connected via line 82 to single acting fluid operated piston device 84, FIGS. 4, 5, and 6.

The flange 86 of piston device 84, FIG. 5, is attached to guides 56 and 58. In FIG. 6, piston device 84, in more detail, includes a piston cylinder 94 in which is located piston 96 having a piston rod 88. A pin ejection rod 90 is secured to the extended end of rod 88 for displacement in directions 98 on and parallel to axis 92, FIG. 5. A compression spring 100 is located within cylinder 94 between piston 96 and a cylinder base wall around rod 88 for urging piston 96 in direction 98' to the piston idle state. In the absence of pressurized fluid supplied on line 82 to cylinder 94, piston 96 remains in or returns to the retracted state, direction 98', due to the force of spring 100 assuming valves V1 and V2 are in the vent state.

In FIG. 6, when the valve V1 lever 72 is depressed in direction 68 by insertion of the tube 10 in channel 70 (FIG. 4), valve V1 is placed in state A coupling source P to output line 80 via conduit 80'. This supplies presurized fluid to valve V2 which creates a short duration pressurized fluid pulse on valve V2 output line 82 in a known way. For example, valve V2 is normally in the B' state. The valve then switches from the pulse generating state B' to the vent state A' after a short period determined by the valve's internal circuit. At the end of this period the valve automatically stops the flow of pressurized air to line 82 because input I' is decoupled from output O'. Valve V1 lever 72 must be released to remove the pressure from valve V2 to return V2 to state B'. This pulse immediately activates piston 96, displacing it in direction 98". It does not matter how long the lever 72 remains depressed, i.e., valve V1 remains in state A, because the pulse is of sufficient duration to provide a full stroke of piston 96 in direction 98'". Lever 72 automatically retracts upon removal of the tube 10. The piston 96 at the end of its full stroke in direction 98" when the pulse terminates by the automatic switching of the valve V2 from state B' to the vent state A', is immediately forced by spring 100 to its initial start position. This latter action occurs when chamber 94 is allowed to vent to the ambient atmosphere via line 82 and conduit 82' of valve V2 in state A' and valve V1 in state B.

The valve V1 roller lever 72, FIG. 4, is aligned in spaced relation relative to the ejection rod 90 axis 92 such that pin 44 axis 42 is aligned on or close to axis 92 with pin 90 when lever 72 is sufficiently depressed to activate valve V1. The alignment of axis 42 with axis 92 aligns ejection rod 90 with pin 44 of the inserted tube. The lever 72 is depressed by engagement of the tube 10 end surface 102, FIG. 4, upon insertion of the tube 10 into guide channel 70. During the insertion the tube abuts the upper surface of plate 54 and the facing guide surfaces 57 and 57' of respective guides 56 and 58.

In operation, an operator inserts the tube 10 with the leg portions 14 and 16 facing upwardly and the base portion 28 resting on plate 54 in channel 70. The tube base wall 28 is in sliding contact with the plate 54 in channel 70, the pin 44 head 46 enters aperture 55 in plate 54, permitting the tube wall 28 to be flush with plate 54. The tube is displaced further in direction 68, FIG. 4, with the pin 44 head 46 in aperture 55 until the tube end 102 engages the lever 72. The lever 72 is depressed by continuing the displacement of tube 10 in direction 68. When the lever 72 bottoms, e.g., can no longer displace, and the tube 10 is no longer movable in direction 68, the pin 44 is aligned on axis 92 and the ejection rod 90 is aligned with pin 44 and the pin receiving aperture 55 in plate 54. The depression of lever 72 automatically causes valve V1 to switch states to supply the pressurized fluid pulse to device 84 via ine 82. This pulse immediately activates piston 96, FIG. 6, and ejection rod 90. Rod 90 engages pin 44 and pushes it out of locking engagement with the tube 10 in direction 98" through aperture 55.

After the ejection rod 90 completes its downward stroke valve V2 changes to the A' or vent state, returning rod 90 to its initial position in response to the compressed state of spring 100. Upon ejection of the enlarged bulbous portion 48, FIG. 2, through aperture 40 of tube wall 28, the pin 44 pops out of the tube through the aperture 55 in plate 54 and drops via gravity into a receptacle (not shown). The operator removes the tube 10 which causes valve V1 to return to the B or vent state causing line 80 to lose pressure which returns valve V2 to the B' state. The operator may now place another tube in channel 70 to repeat the process. Because the system operates automatically upon insertion of the tube which is readily manually inserted and removed within a matter of seconds, relatively high production can be achieved without damage to either the locking pin 44 or the storage tube 10. Because the system employs fluids, no electrical currents flow in areas adjacent to the tube creating static charges which might electrically affect the integrated circuits contained within the tube 10. A pneumatic system is disclosed herein, however, the system may also be hydraulically operated. Also, although a piston actuator is disclosed in this embodiment, it should be understood that other types of fluid operated actuators may be used to eject the retaining pin.

The roller lever 72 abuts the end surface 102 of the tube 10 without damage to the tube 10 and is actuated without permanent deformation of the tube 10. The tube 10 at its end is relatively rigid in direction 68 and readily depresses lever 72 for actuating valve V1. The tubes and pins so processed are reusable and effect a significant cost saving by alleviating the frequent replacement of damaged tubes which might otherwise occur.

What is claimed is:

1. Automatic pin extraction apparatus for removing a pin from an elongated U-shaped cross-section tube, said pin including an enlarged bulbous shaft portion for interlocking said pin with a wall of said tube, said apparatus comprising:

guide means for aligning said tube and pin in a given reference position;

pin ejection means including sense means coupled to the guide means for sensing the presence of said aligned tube and pin, and fluid operated means coupled to the sense means for automatically ejecting the pin from said tube in response to the sensed aligned tube and pin; and means adapted to receive fluid from a source of pressurized fluid;

said sense means including means for generating a pluse of said received pressurized fluid in response to the sensed alignment of said tube at said reference position, said fluid operated means including actuating means responsive to said pluse applied as an input thereto for ejecting said pin.

2. Automatic pin extraction apparatus for removing a pin from an elongated U-shaped cross-section tube, said pin including an enlarged bulbous shaft portion for interlocking said pin with a wall of said tube, said apparatus comprising:

guide means for aligning said tube and pin in a given reference position and orientation;

pin ejection means coupled to said guide means responsive to pressurized fluid selectively applied thereto and aligned with said pin when said tube is in said reference position for ejecting the pin from the tube; and valve means adapted to receive pressurized fluid at an input thereto and including tube sense means responsive to the engagement of said tube therewith when said tube is in said given reference position for automatically selectively applying said received pressurized fluid to said ejection means for actuating said pin ejection means to thereby eject said pin from said tube.

3. The apparatus of claim 2 wherein said valve means includes first and second valves serially coupled between said source of fluid pressure and said ejection means, said first valve including valve operating means responsive to the placement of said tube in said reference position for coupling said fluid pressure source to said second valve and said second valve includes means responsive to said applied pressurized fluid from the first valve for automatically applying a pressurized fluid pulse of a given time duration to said ejection means.

4. The apparatus of claim 3 wherein said ejection means includes a piston having an eject state and an idle state, said ejection means including resilient means for automatically urging said piston into said idle state upon termination of said fluid pulse at the end of said duration.

5. The apparatus of claim 2 wherein said guide means includes a support plate having a pin receiving aperture aligned with said ejection means for receiving said ejected pin and first and second guide walls forming a tube alignment channel with said support plate, said channel and said sense means being adapted to cause said sense means to automatically sense said tube when said pin is aligned with said aperture and ejection means.

6. The apparatus of claim 2 wherein said fluid is air and said pin ejection means and valve means includes pneumatic means responsive to said pressurized air for ejecting said pin from said tube.

* * * * *

UNITED STATES PATENT AND TRADEMARK OFFICE
CERTIFICATE OF CORRECTION

PATENT NO. : 4,620,366

DATED : November 4, 1986

INVENTOR(S) : Ooi T. Koon

It is certified that error appears in the above-identified patent and that said Letters Patent is hereby corrected as shown below:

Column 5, lines 12 and 15, "pluse" should be --pulse--.

Signed and Sealed this

Tenth Day of February, 1987

*Attest:*

DONALD J. QUIGG

*Attesting Officer*  *Commissioner of Patents and Trademarks*